United States Patent [19]
Fujimura et al.

[11] Patent Number: 5,773,201
[45] Date of Patent: Jun. 30, 1998

[54] METHOD OF STRIPPING A RESIST MASK

[75] Inventors: Shuzo Fujimura, Tokyo; Keisuke Shinagawa, Kawasaki; Naomichi Abe, Tokyo, all of Japan

[73] Assignee: Fujitsu Limited, Kawasaki, Japan

[21] Appl. No.: 193,893

[22] Filed: Feb. 9, 1994

Related U.S. Application Data

[63] Continuation of Ser. No. 69,402, Apr. 30, 1993, abandoned, which is a continuation of Ser. No. 590,595, Sep. 27, 1990, abandoned, which is a continuation of Ser. No. 232,096, Aug. 15, 1988, abandoned.

[30]  Foreign Application Priority Data

Aug. 19, 1987 [JP] Japan ................................. 62-203985

[51] Int. Cl.⁶ .............................. B03F 7/42; C23C 15/00
[52] U.S. Cl. ......................... 430/329; 430/330; 156/345; 156/643.1; 156/646.1; 204/192.36; 204/192.37; 204/298.31; 204/298.33
[58] Field of Search .................................... 430/329, 330; 156/643, 646, 345; 204/192.36, 192.37, 298.31, 298.33

[56]  References Cited

U.S. PATENT DOCUMENTS

| | | | |
|---|---|---|---|
| 3,837,856 | 9/1974 | Irving et al. | 430/329 X |
| 4,292,384 | 9/1981 | Straughan et al. | 430/5 |
| 4,512,868 | 4/1985 | Fujimura et al. | 156/643 |
| 4,983,254 | 1/1991 | Fujimura et al. | 204/193.36 |
| 4,987,284 | 1/1991 | Fujimura et al. | 204/298.33 |
| 5,057,187 | 10/1991 | Shinagawa et al. | 204/192.36 |

FOREIGN PATENT DOCUMENTS

| | | |
|---|---|---|
| 216603 | 4/1987 | European Pat. Off. . |
| A-0216603 | 4/1987 | European Pat. Off. . |

OTHER PUBLICATIONS

Journal of the Electrochemical Society, vol. 129, No. 11, Nov. 1982, "Decapsulation and Photoresist Stripping in Oxygen Microwave Plasmas", by Z. Zioba et al., pp. 2537–2541.

Journal of the Electrochemical Society, vol. 124, No. 1, Jan. 1977, "The Reduction of Photoresist Stripping Rates in an Oxygen Plasma By–Product Inhibition and Thermal Mass", by J. F. Battey, pp. 147–152.

Extended Abstracts, vol. 83, No. 1, May 1983, "A New High Efficiency, Sub–Megahertz Exitation Frequency, Inductively Coupled Plasma Generator for High Rate Downstream Photo–Resist Stripping and Isotrophic Etching", by C.B. Zarowin et al., p. 253.

Patent Abstracts of Japan, vol. 10, No. 223 (P–483)(2279), Aug. 5, 1986 & JP-A-61-59338 (Fujitsu Ltd.) 26 Mar. 1986.

Patent Abstracts of Japan, vol. 10, No. 206 (P–478)(2262) Jul. 18, 1986, & JP-A-61 46751 (Fujitsu Ltd.) 07 Mar. 1986.

J. Electrochem. Soc.: Solid–State Science and Technology, Mar. 1977, vol. 124, No. 3, "The Effects of Geometry on Diffusion–Controlled Chemical Reaction Rates in a Plasma", James F. Battey, pp. 437–441.

J. Electrochem. Soc.: Solid–State Science and Technology, Dec. 1977, vol. 124, No. 12, "The Ultimate By–Products of Stripping Photoresist in an Oxygen Plasma", R.F. Reichelderfer et al., pp. 1926–1927.

Journal of Applied Physics, vol. 51, No. 6, Jun. 1980, "Optical Emission Spectroscopy of Reactive Plasmas: A Method for Correleating Emission Intensities to Reactive Particle Density", Coburn et al., pp. 3134–3136.

*Primary Examiner*—John S. Chu
*Attorney, Agent, or Firm*—Staas & Halsey

[57]  ABSTRACT

A method for removing a used organic resist in a downstream ashing apparatus on a silicon semiconductor wafer in which water vapor is added to an oxygen plasma gas generated by microwaves. The addition of the water vapor lowers an activation energy of the ashing reaction and increases the reactive species generated in the plasma. Accordingly, the ashing rate is increased even at a wafer processing temperature as low as 150° C. The addition of water vapor increases the ashing rate for a wide range of the percentage of water content, such as 5 to 80%, allowing easy control of the process. The lowered operating temperature prevents contamination of the semiconductor wafer. Since $CF_4$ is not used the $SiO_2$ layer is protected from being undesirably etched and the semiconductor characteristics do not deteriorate.

19 Claims, 3 Drawing Sheets

METHOD OF STRIPPING A RESIST MASK

This application is a continuation of application Ser. No. 08/069,402, filed Apr. 30, 1993, now abandoned, which is a continuation of application Ser. No. 07/590,595, filed Sep. 27, 1990, now abandoned, and which is a continuation of Ser. No. 07/232,096, filed Aug. 15, 1988, now abandoned.

BACKGROUND OF THE INVENTION

This invention is directed to a method of stripping a resist mask (referred to hereinafter as ashing).

As is well known, a mask made of an organic photoresist, etc., is necessarily employed in a photo-lithography technique for fabricating semiconductor devices. After the photoresist is exposed to light for the photo-lithography technique the resist must be removed. A dry plasma etching method, particularly a downstream ashing method, is widely used for removing the used photo-resist. A downstream etching apparatus which can be employed is disclosed in U.S. Pat. No. 4,512,868 by the present inventor. This apparatus has been used for processing a silicon wafer, etc., where the wafer is protected from being bombarded by charged plasma particles.

The reaction gas used for ashing the organic photoresist is, for example, an oxygen gas including a $CF_4$ (carbon tetra-fluoride) gas. However, it is not always easy to remove the used resist. This is because the resist has been affected by its exposure to light during an exposure process and also its exposure to plasma during a prior silicon etching process, and therefore has become hardened. Furthermore, the $CF_4$ gas is apt to undesirably etch the silicon wafer.

For improving the ashing rate, there is a method in which nitrogen gas is added to oxygen containing a reaction gas for increasing the number of oxygen atoms as a reaction species. In this method, for example, in which the reaction gas contains 10% nitrogen, the ashing rate is 0.3 µm/minute at 180° C. The increase of the ashing rate achieved with this method is still limited, however, because the reactive species are mainly only the oxygen atoms. The function of the added nitrogen gas is considered to increase only the number of oxygen atoms as the reactive species.

Another method for increasing the number of oxygen atoms is by employing a known plasma etching method in which a small amount of water vapor is added to the oxygen plasma gas. However, no extensive study or application of this method has been carried out.

SUMMARY OF THE INVENTION

It is an object of the present invention to provide an improved ashing method for quickly stripping a used resist on a semiconductor wafer.

It is another object of the present invention to lower the activation energy of the reaction, and accordingly lower the reaction temperature.

It is still another object of the present invention to prevent deterioration of the semiconductor wafer caused by contamination due to a metal component contained in the resist.

It is a further object of the present invention to avoid the use of $CF_4$ gas so as to avoid an undesirable etching of a silicon wafer during the resist stripping, and accordingly prevent the lowering of the withstand voltage of an insulation layer.

According to the present invention a downstream etching apparatus is employed in which water vapor is added to an oxygen gas as a reaction gas. The amount of added water vapor is preferably more than 1 per cent of the total reaction gas with respect to the flow rate.

The addition of water vapor into the oxygen gas increases the reactive species and accordingly the ashing rate at a wafer processing temperature is as low as 150° C. The lowered ashing temperature prevents metal atoms from contaminating the semiconductor wafer.

The above-mentioned features and advantages of the present invention, together with other objects and advantages which will become apparent, will be more fully described hereinafter, with reference being made to the accompanying drawings which form a part hereof, wherein like numerals refer to like parts throughout.

DESCRIPTION OF THE PREFERRED EMBODIMENTS

Figure 1:
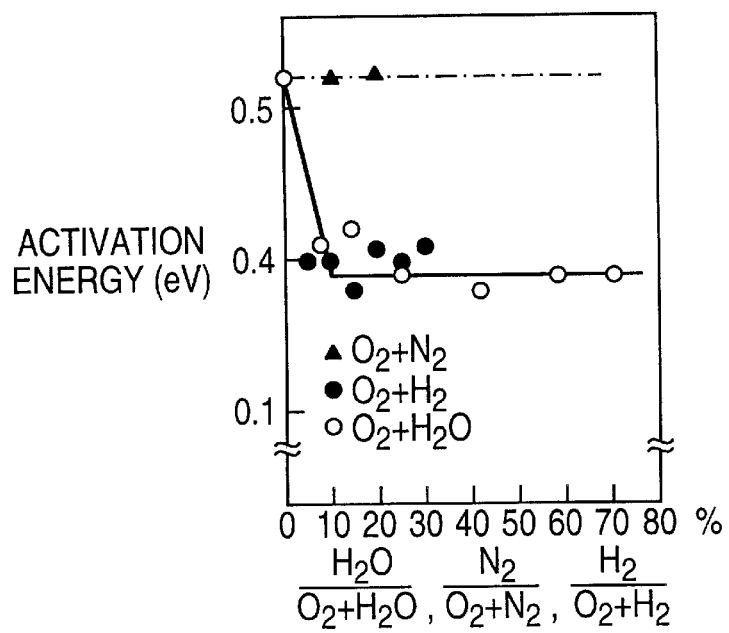
FIG. 1 is a graph of the effects of water on the activation energy added to various reaction gases.
Figure 2:
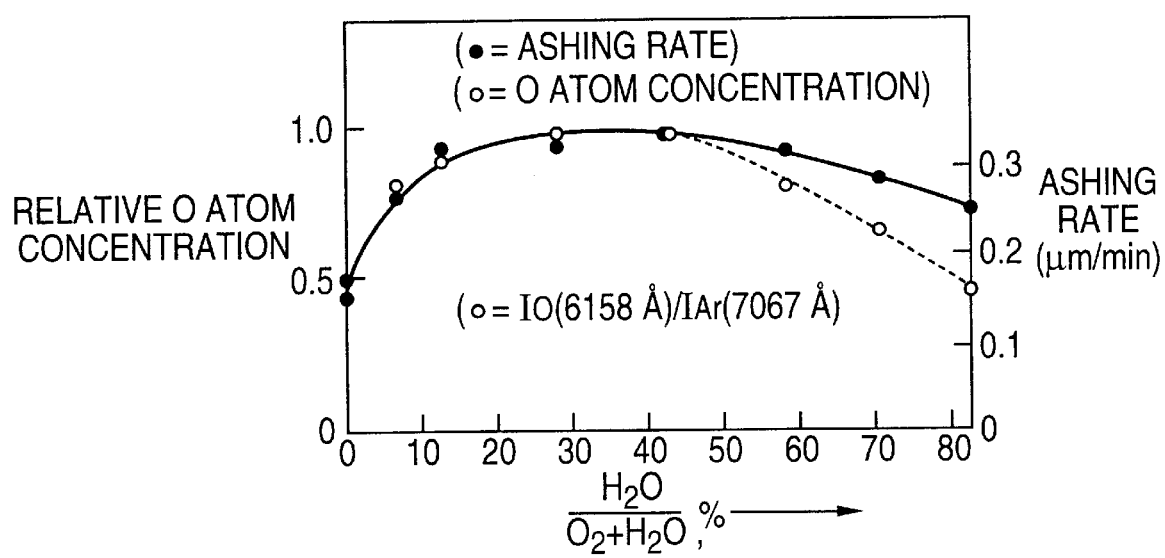
FIG. 2 is a graph of the effects of water added to an oxygen gas with respect to the ashing rate and the amount of atomic oxygen in the oxygen plasma according to the present invention.
Figure 3:
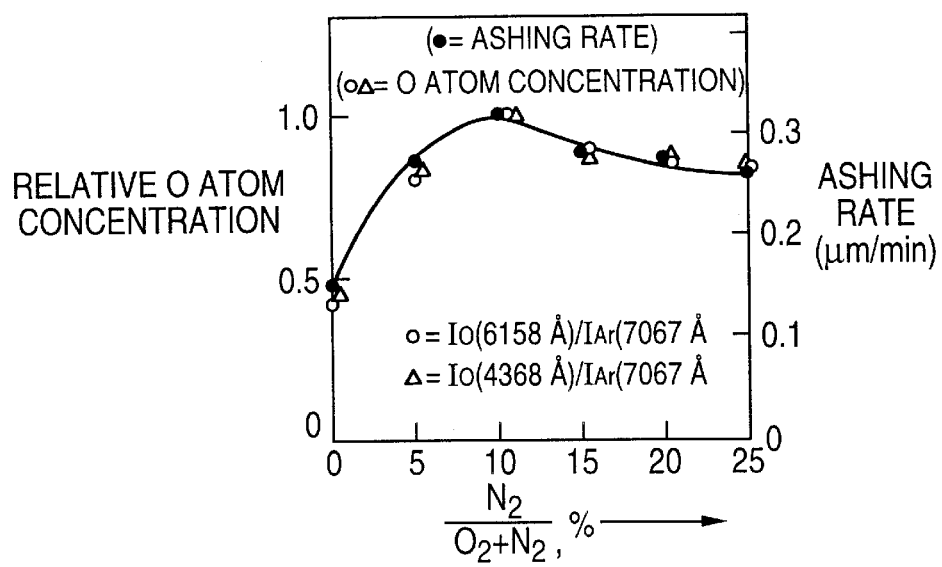
FIG. 3 is a graph of the effects of nitrogen added to an oxygen gas with respect to the ashing rate and the amount of atomic oxygen in prior art gas plasma.
Figure 4:
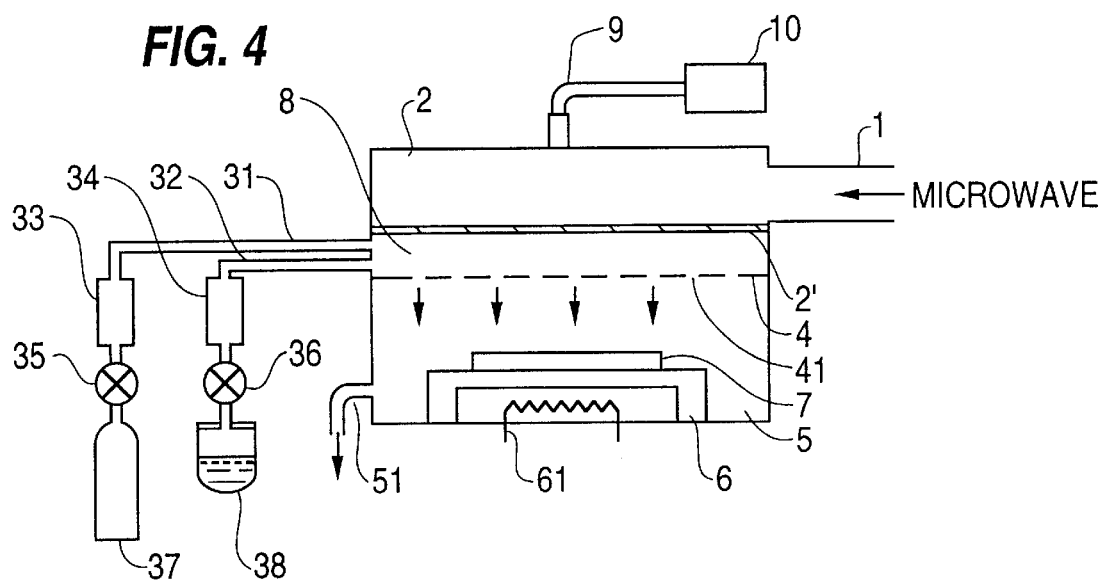
FIG. 4 is a downstream ashing apparatus according to an embodiment of the present invention.

Referring to FIG. 1 through FIG. 3, the effects of the present invention are presented. An apparatus used for obtaining the data in FIGS. 1 to 3 is schematically illustrated in FIG. 4. This apparatus is commonly used for downstream ashing, where microwaves, having a power of typically 2.45 GHz, are fed through a waveguide 1 into a microwave cavity 2. A plasma generating chamber 8 is a part of the cavity 2 and is vacuum-sealed by a quartz plate 2' which is transparent to the microwaves. Reaction gases of oxygen and water are fed from outside sources 37 and 38 through valves 35 and 36, and flow meters 33 and 34, respectively, to the plasma generating chamber 8. Accordingly, a plasma of the reaction gases is generated in the plasma generating chamber 8. On a wall 4, opposite to the quartz plate 2', of the plasma generating chamber 8 many small holes 41 are provided which connect the plasma generating chamber 8 to a reaction chamber 5 but act as a shield to the microwaves. A reactive species, such as oxygen atoms, generated in the plasma which flows out of the plasma generating chamber 8 through the holes 41 into the reaction chamber 5, as shown by arrows in FIG. 4. In the reaction chamber 5, a semiconductor wafer 7 to be processed is placed on a stage 6 in the flow of the reaction gas from the holes 41. The reactive species reacts with the resist on the semiconductor wafer 7. The temperature of the stage 6 is raised and controlled by a heater 61 installed in the stage. The reaction gas in the reaction chamber 5 is evacuated by a pump (not shown in the figure) through an outlet 51.

With respect to the ashing process, the wafer 7 on the stage is heated to as high as approximately 200° C. while the chamber 5 is evacuated to approximately 0.01 Torr by the pump. Next, the inner pressure of the reaction chamber 5 is raised to a pressure of approximately 0.8 Torr and approximately 1.5 kW of power (via microwaves) is applied to the plasma generating chamber 8 so as to generate a gas plasma therein.

FIG. 1 is a graph of the effects on the activation energy of adding water, nitrogen or hydrogen to an oxygen gas, measured by their flow rate ratio. In FIG. 1 it is shown that the activation energy is lowered from approximately 0.5 eV to approximately 0.4 eV by adding hydrogen or water; however, no effect is observed by adding nitrogen. On the other hand, as is well known, a speed constant k of a chemical reaction is generally given by the following formula named Arrhenius' equation:

$$k = A \exp(-E/RT)$$

where A indicates a frequency factor, E indicates an activation energy, R indicates a gas constant and T indicates absolute temperature. Therefore, a lowered value of the activation energy means a faster reaction at a certain temperature. That is, a certain reaction speed is achieved at a lower temperature.

The effects of adding water were observed by the inventors, and are shown in FIG. 2. The results in FIG. 2 were obtained by using the apparatus in FIG. 4 under the conditions of a reaction gas flow of 1,000 cc/min, including adding oxygen gas having water vapor and 50 sccm of argon gas. The wafer temperature is kept at 180° C. The percentage of the water vapor content, $H_2O/(O_2+H_2O)$, is measured by flow rate. The argon gas, which has no effect on the ashing reaction, is added thereto just for generating a standard light spectrum with which oxygen atoms, etc., can be quantitatively compared using an actinometry technique, which is as reported by J. W. Coburn et al., "Journal Applied Physics", Vol. 51, No. 6, pp. 3134 (1980). A glass fiber 9 is installed on the wall of the cavity 2 to measure the light generated in the plasma through the transparent quartz plate 2', which is also optically transparent. Another end of the glass fiber 9 is connected to a monochromator 10. In FIG. 2, black dots indicate an ashing rate scaled by the right hand side vertical axis, and white dots indicate the relative oxygen atom concentration scaled by the left hand side vertical axis. The relative oxygen atom concentration is measured by an actinometry method, i.e., by the ratio of the intensity of a 6158 Å oxygen atom spectrum to the intensity of a 7067 Å argon spectrum.

It can be seen in FIG. 2 that an addition of approximately 10% to 60% water vapor almost doubles the ashing rate compared to when no water is added. The ashing rate is completely related to the amount of the oxygen atom concentration. However, in a range of over 50% water content, the ashing rate curve slowly falls but the oxygen atom concentration curve falls faster than the ashing rate curve. This separation of the oxygen atom concentration curve from the ashing rate curve suggests that another reactive species, such as an OH (hydroxide) radical, etc., is also contributing to the ashing reaction. For comparison, the effect of adding nitrogen to oxygen is shown in FIG. 3, for which the total gas flow and the temperature are the same as those in FIG. 2.

In FIG. 3, the black and white dots, respectively, represent the same thing as in FIG. 2, and the triangles represent a relative concentration of the oxygen atoms measured at a 4368 Å oxygen atom spectrum. In FIG. 2 and FIG. 3, the ashing rates are almost the same, i.e., 0.3 μm/minutes at 180° C. When the activation energy is lowered, however, an ashing rate of 0.15 μm/minutes for 40% water-containing oxygen is achieved at as low as 150° C., compared with an ashing rate of 0.1 μm/minute for 10% nitrogen-containing oxygen which is optimum for the fastest ashing rate at the same temperature. These data are not shown in the figures. A lowered temperature for the ashing process is significantly advantageous in that the semiconductor wafer is protected from contamination by the metal components in the resist material. As is well known, metal contamination deteriorates the semiconductor properties, i.e., heavy metals lower the minority carrier generation lifetime, and alkaline metals contaminate the semiconductors.

As seen in FIG. 2, the curve of the ashing rate for water-containing oxygen is relatively flat over a wide range of water content, i.e., approximately 10% to 80%, and is much wider than the range of 5% to 15% for nitrogen-containing oxygen, as shown in FIG. 3. This is advantageous for easy control of an ashing operation during a production stage.

The beneficial advantage of avoiding the use of $CF_4$ is as follows. When 10% $CF_4$-containing oxygen gas is used for resist etching in a downstream apparatus, the $SiO_2$ layer on the semiconductor wafer is also undesirably etched. The ratio of the resist ashing rate to the $SiO_2$ etching rate, i.e., the selectivity, is typically 300 to 500. That is, while 1 μm of the resist is ashed, the $SiO_2$ is etched, for example, 30 Å. This undesirable etching of the underlying $SiO_2$ layer used for a gate insulation lowers the withstand voltage of the gate insulation, or deteriorates the electrical characteristics of the semiconductor circuits. The same problem exists with polycrystalline silicon, SiN, or aluminum, as well. This problem has not been so serious in fabricating conventional relatively low-density LSI (large scale integrated circuits) because the insulation layer is as thick as 1000 Å for a 16K bit memory device. However, this problem is now becoming serious for fabricating the most up-to-date 1M bit memory devices, because the insulation layer is as thin as 200 Å or less. According to the method of the present invention, there is no longer an undesirable etching problem of the $SiO_2$ layer or any other layer.

As described above, in the downstream ashing apparatus, the gas plasma, i.e., the electromagnetic power necessary for generating the plasma, is confined in the plasma generating chamber by a shielding wall 4. Only the reactive species generated in the plasma comes out via the small holes 41 in the shielding wall 4. The holes shield the electromagnetic waves but allow the reactive species to pass therethrough to react with the resist material. Therefore, the wafer is protected from bombardment by the charged particles, such as ions, which may cause deterioration of the semiconductor materials. Therefore, the reaction is purely chemical. The above-described beneficial effects of adding water vapor to an oxygen gas can be significantly enhanced by also combining the beneficial effects of the downstream apparatus. Therefore, the apparatus is highly appreciated in the production of VLSI (very large scale integrated circuits) especially with respect to, for example, submicron integration.

Figure 5:
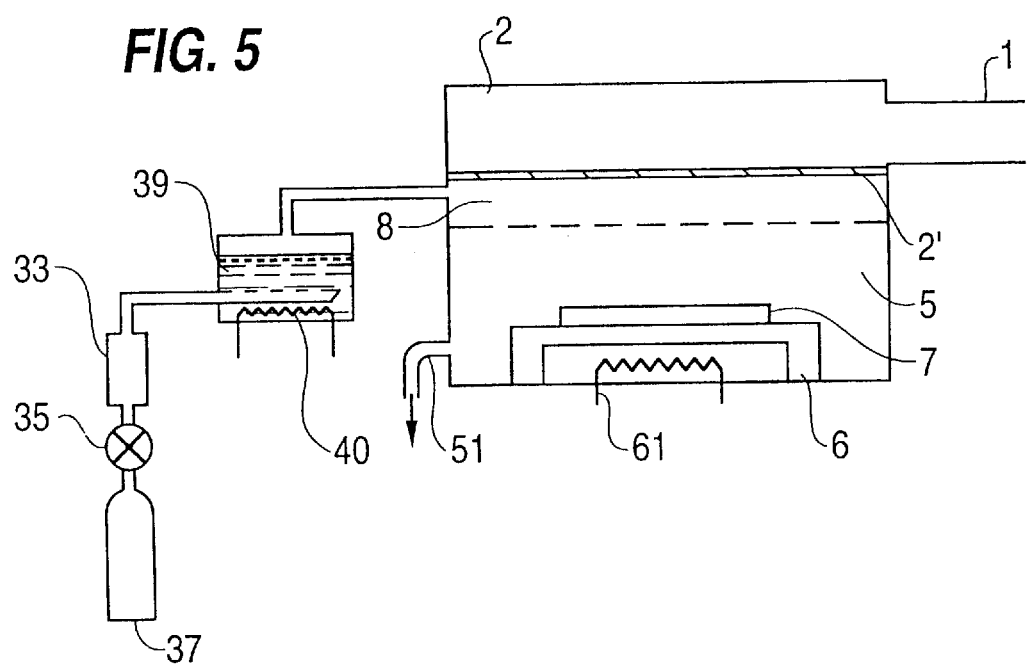
FIG. 5 is an apparatus for mixing the water vapor into oxygen gas according to the embodiment of the present invention.

Preferred typical methods of adding water vapor to oxygen gas are schematically illustrated in FIGS. 4 and 5. In FIG. 5, the same or equivalent parts are denoted by the same numbers as those in FIG. 4. In the apparatus of FIG. 4, the plasma generating chamber 8 is provided with two gas inlets 31 and 32 for introducing oxygen gas and water vapor respectively and independently from each other. Each gas is supplied to the inlet 31 and 32 from each gas source 37 and 38 through control valves 35 and 36 and flow meters 33 and 34, respectively. If the gases are to be fed into the plasma generating chamber 8 through a single inlet, the amount of mixing necessary to mix the water vapor into the oxygen gas is influenced by the amount of oxygen gas flow and the fluid resistance of the inlet pipe where the inlet pipe connects to the plasma generating chamber 8. In this apparatus, it is not easy to control a large amount of water vapor, for example, more than 10%, to be added to the oxygen gas because of the relatively high gas pressure of the oxygen gas caused by the fluid resistance of the inlet pipe. However, this problem can be solved.

In the apparatus of FIG. 5, the water vapor is mixed into the oxygen while the oxygen gas is flowing. That is, the water vapor is bubbled through heated water 39 on the way from the gas source 37 to the plasma generating chamber 8. The amount of added water vapor is determined by the balance of the vapor pressure of the heated water 39 at its present temperature and the pressure of the oxygen. The water vapor pressure can be raised and controlled by the temperature of the water through which the oxygen gas is flowing. The water temperature is controlled by the heater 40. Because of the relatively high vapor pressure of the heated water, a considerable amount, such as more than 10%, of water vapor can be easily mixed with precision into the oxygen gas.

In FIG. 1, the addition of a hydrogen gas into oxygen gas effectively lowers the activation energy. However, as is well known, a mixture of more than 3% hydrogen gas in oxygen gas will cause an explosion. Therefore, hydrogen gas cannot be industrially employed as a plasma reaction gas.

The many features and advantages of the invention are apparent from the detailed specification and thus, it is intended by the appended claims to cover all such features and advantages of the method which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What is claimed is:

1. A downstream ashing method for removing an organic resist film from a semiconductor wafer, said method comprising:

placing a semiconductor wafer having an organic resist film thereon in a reaction chamber;

creating a gas plasma containing both electrically neutral species and charged particles by subjecting a gas containing oxygen to electromagnetic power;

ashing the organic resist film on said semiconductor wafer by exposing the wafer with the film thereon to said neutral species while shielding the wafer from said charged particles; and reducing an activation energy of the ashing reaction between the organic resist film and said neutral species, thereby reducing the temperature necessary to drive the ashing reaction at a predetermined given rate, by causing said gas containing oxygen to also contain a water vapor.

2. A downstream ashing method as set forth in claim 1, wherein said gas plasma is created in a plasma generating chamber adjacent said reaction chamber, and said electrically neutral species are caused to flow out of the plasma generating chamber and into said reaction chamber through holes in a wall between the plasma generating chamber and the reaction chamber.

3. A downstream ashing method as set forth in claim 2, wherein said gas containing oxygen and said water vapor are introduced separately into said plasma generating chamber from respective outside surfaces.

4. A downstream ashing method as set forth in claim 2, wherein said semiconductor wafer is placed within said reaction chamber such that it is protected against exposure to said electromagnetic power during said ashing operation and such that the organic resist reacts only with the electrically neutral species flowing through said holes during said ashing.

5. A downstream ashing method as set forth in claim 2, wherein said oxygen containing gas and said water vapor are each introduced into and exhausted from said plasma generating chamber so that the flow of said electrically neutral species through said holes is continuous during said ashing.

6. A downstream ashing method as set forth in claim 1, wherein the amount of water vapor in said gas containing oxygen is such that an activation energy of ashing the organic resist film is equal to or less than 0.42 eV.

7. A downstream ashing method as set forth in claim 6, wherein the amount of water vapor present in said gas containing oxygen is approximately 5 mol %.

8. A downstream ashing method as set forth in claim 1, wherein the amount of water vapor in said gas containing oxygen is such that the ashing rate of the organic resist is at least 0.3 $\mu$m per minute while the temperature of the semiconductor wafer is at least 150° C.

9. A downstream ashing method as set forth in claim 8, wherein the amount of water vapor present in said gas containing oxygen is approximately 40 mol %.

10. A downstream ashing method as set forth in claim 1, wherein said semiconductor wafer includes an insulating layer having a thickness of 20 nm or less underlying said resist film.

11. A downstream ashing method as set forth in claim 10, wherein said insulating layer is formed from silicon dioxide.

12. A downstream ashing method as set forth in claim 10, wherein said insulating layer is a gate insulating layer of a submicron device for a very large scale integrated circuit.

13. A downstream ashing method as set forth in claim 1, wherein said ashing is carried out by a purely chemical reaction in the absence of any substantial quantity of charged particles.

14. A downstream ashing method as set forth in claim 1, wherein said ashing of the organic resist layer is carried out at a rate no greater than 0.15 $\mu$m per minute and a temperature at which said ashing is carried out is sufficiently low to avoid substantial contamination of said semiconductor wafer by metal.

15. A downstream ashing method as set forth in claim 1, wherein the amount of water vapor present in said oxygen containing gas is such that said ashing of the organic resist layer is carried out at a rate no less than 0.3 $\mu$m per minute while the temperature at which said ashing is carried out is maintained at a level of at least 180° C.

16. A downstream ashing method as set forth in claim 15, wherein the amount of water vapor present in said gas containing oxygen is within the range of from about 14 to about 64 mol %.

17. A downstream ashing method as set forth in claim 1, wherein the amount of water vapor present in said gas containing oxygen is at least about 50 mol %.

18. A downstream ashing method as set forth in claim 1, wherein the ashing reaction is predominantly carried out by reaction between the organic resist layer and hydroxide radicals.

19. A downstream ashing method as set forth in claim 1, wherein the ashing reaction is predominantly carried out by reaction between the organic resist layer and a neutral radical species having a kinetic energy which is essentially a thermal energy.

* * * * *